US011646358B2

(12) United States Patent
Mignot et al.

(10) Patent No.: US 11,646,358 B2
(45) Date of Patent: May 9, 2023

(54) SACRIFICIAL FIN FOR CONTACT SELF-ALIGNMENT

(71) Applicant: INTERNATIONAL BUSINESS MACHINES CORPORATION, Armonk, NY (US)

(72) Inventors: Yann Mignot, Slingerlands, NY (US); Indira Seshadri, Niskayuna, NY (US); Su Chen Fan, Cohoes, NY (US); Christopher J. Waskiewicz, Rexford, NY (US); Eric Miller, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/728,437

(22) Filed: Apr. 25, 2022

(65) Prior Publication Data
US 2022/0262923 A1  Aug. 18, 2022

Related U.S. Application Data

(63) Continuation of application No. 16/849,072, filed on Apr. 15, 2020, now Pat. No. 11,316,029.

(51) Int. Cl.
*H01L 29/66* (2006.01)
*H01L 21/28* (2006.01)
(Continued)

(52) U.S. Cl.
CPC .. *H01L 29/66515* (2013.01); *H01L 21/28088* (2013.01); *H01L 29/41791* (2013.01);
(Continued)

(58) Field of Classification Search
CPC ......... H01L 29/66515; H01L 29/41791; H01L 29/4966; H01L 29/6681; H01L 29/7851; H01L 21/28088
See application file for complete search history.

(56) References Cited

U.S. PATENT DOCUMENTS

| 6,686,231 B1 | 2/2004 | Ahmed et al. |
| 9,048,262 B2 | 6/2015 | Adam et al. |

(Continued)

OTHER PUBLICATIONS

List of IBM Patents or Patent Applications Treated as Related dated Apr. 25, 2022, 2 pages.

*Primary Examiner* — Christine A Enad
(74) *Attorney, Agent, or Firm* — Tutunjian & Bitetto, P.C.; Joseph P. Curcuru

(57) ABSTRACT

A method is presented for forming a self-aligned middle-of-the-line (MOL) contact. The method includes forming a fin structure over a substrate, depositing and etching a first set of dielectric layers over the fin structure, etching the fin structure to form a sacrificial fin and a plurality of active fins, depositing a work function metal layer over the plurality of active fins, depositing an inter-layer dielectric (ILD) and a second set of dielectric layers. The method further includes etching the second set of dielectric layers and the ILD to form a first, via portion and to expose a top surface of the sacrificial fin, removing the sacrificial fin to form a second via portion, and filling the first and second via portions with a conductive material to form the MOL contact in the first via portion and a contact landing in the second via portion.

20 Claims, 8 Drawing Sheets

(51) Int. Cl.
*H01L 29/49* (2006.01)
*H01L 29/78* (2006.01)
*H01L 29/417* (2006.01)

(52) U.S. Cl.
CPC ...... *H01L 29/4966* (2013.01); *H01L 29/6681* (2013.01); *H01L 29/7851* (2013.01)

(56) References Cited

U.S. PATENT DOCUMENTS

| | | |
|---|---|---|
| 9,312,384 B2 | 4/2016 | Lo et al. |
| 9,472,447 B1 | 10/2016 | Kanakasabapathy et al. |
| 9,704,990 B1 | 7/2017 | Mochizuki et al. |
| 9,768,072 B1 | 9/2017 | Cheng |
| 9,799,570 B1 | 10/2017 | Cheng |
| 9,831,317 B1 | 11/2017 | Zang et al. |
| 10,242,881 B2 | 3/2019 | Cheng et al. |
| 10,505,048 B1 | 12/2019 | Xu et al. |
| 2016/0336225 A1 | 11/2016 | Chen et al. |
| 2017/0005169 A1 | 1/2017 | Loubet et al. |
| 2018/0012969 A1* | 1/2018 | Cheng ............. H01L 21/823431 |
| 2018/0197787 A1 | 7/2018 | Anderson et al. |
| 2019/0181238 A1 | 6/2019 | Wang et al. |
| 2020/0135872 A1* | 4/2020 | Zang ................ H01L 29/41775 |
| 2020/0321244 A1* | 10/2020 | Fan ..................... H01L 29/7851 |

\* cited by examiner

SACRIFICIAL FIN FOR CONTACT SELF-ALIGNMENT

BACKGROUND

The present invention relates generally to semiconductor devices, and more specifically, to a placement of a contact landing on a sacrificial fin with self-alignment capability.

A Field Effect Transistor (FET) usually has a source, a channel, and a drain, where current flows from the source to the drain, and a gate that controls the flow of current through the channel. FETs can have a variety of different structures, for example, FETs have been fabricated with the source, channel, and drain formed in the substrate material itself, where the current flows horizontally (e.g., in the plane of the substrate), and finFETs have been formed with the channel extending outward from the substrate, but where the current also flows horizontally from a source to a drain. A vertical finFET can also be configured with a bottom source/drain in the substrate and a top source/drain on the vertical fin, where the current then flows in a direction perpendicular to the substrate. The channel for the finFET can usually be an upright slab of thin rectangular Si, commonly referred to as the fin with a gate on the fin. Depending on the doping of the source and drain, an n-FET or a p-FET can be formed. Examples of FETs can include a metal-oxide-semiconductor field effect transistor and an insulated-gate field-effect transistor. Two FETs also can be coupled to form a complementary metal oxide semiconductor (CMOS), where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment, a method is provided for forming a self-aligned middle-of-the-line (MOL) contact in MOL processing. The method includes forming a fin structure over a substrate, depositing and etching a first set of dielectric layers over the fin structure, etching the fin structure to form a sacrificial fin and a plurality of active fins, depositing a work function metal (WFM) layer over the plurality of active fins, depositing an inter-layer dielectric (ILD) over the sacrificial fin and the plurality of active fins, depositing a second set of dielectric layers, etching the second set of dielectric layers and the ILD to form a first via portion and to expose a top surface of the sacrificial fin, removing the sacrificial fin to form a second via portion; and filling the first and second via portions with a conductive material to form the self-aligned MOL contact in the first via. portion and a contact landing in the second via portion such that the contact landing separates the self-aligned MOL contact from the substrate.

In accordance with another embodiment, a method is provided for forming a self-aligned middle-of-the-line (MOL) contact in MOL processing. The method includes forming a sacrificial fin and a plurality of active fins over a substrate by employing a U-shaped mandrel, depositing a work function metal (WFM) layer over the plurality of active fins, depositing an inter-layer dielectric (ILD) over the sacrificial fin and the plurality of active fins, depositing dielectric layers over the ILD, etching the dielectric layers and the ILD to form a first via portion extending to a top surface of the sacrificial fin, removing the sacrificial fin to form a second via portion, and filling the first and second via portions with a conductive material to form the self-aligned MOL contact in the first via portion and a contact landing in the second via portion.

In accordance with yet another embodiment, a semiconductor structure is provided for forming a self-aligned middle-of-the-line (MOL) contact in MOL processing. The semiconductor structure includes a first MOL, contact disposed over an active fin formed over a substrate and a second MOL contact disposed over a contact landing, wherein the contact landing separates the second. MOL contact from the substrate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 3:
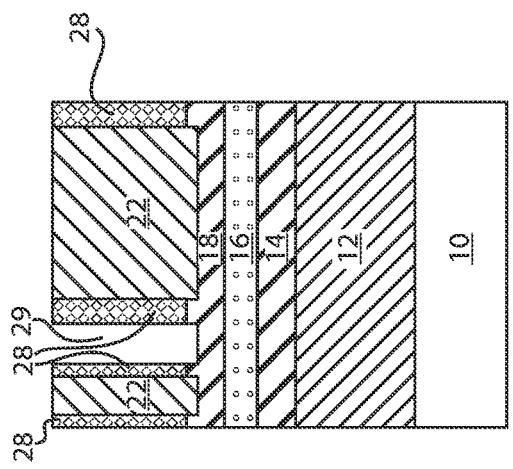
FIG. 3 is a cross-sectional view of the semiconductor structure of FIG. 2 where the spacer is etched back, in accordance with an embodiment of the present invention.

Embodiments in accordance with the present invention provide methods and devices for employing Self-Aligned-Double-Patterning (SADP) sacrificial fins for self-aligned middle-of-the-fine (MOL) contacts. The goal in integrated circuit fabrication is to accurately reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength immersion photolithography tools, cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. Generally speaking, double patterning is an exposure method that involves splitting (dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern is printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features that would otherwise be difficult using existing photolithography tools. The SADP process is one such multiple technique. The SADP process can be an attractive solution for manufacturing next-generation devices, particularly metal routing lines on such next-generation devices, due to better overlay control that is possible when using an SADP process.

Semiconductor fabrication, traditionally including Front-End-Of-The-Line (FEOL), Middle-Of-The-tine, (MOL), and Back-End-Of-The-Line (BEOL), constitutes the entire process flow for manufacturing modern computer chips. The usual FEOL processes include wafer preparation, isolation, well formation, gate patterning, spacer, extension and source/drain implantation, silicide formation, and dual stress liner formation. The BEOL processes include dielectric film deposition, patterning, metal fill and planarization by chemical mechanical polishing. The MOL is mainly gate contact formation, which is an increasingly challenging part of the whole fabrication flow, particularly for lithography patterning. MOL contacts can have a narrow pitch area with a very high aspect ratio. A pitch refers to a minimum center-to-center distance between interconnect lines. Lithographic overlay can jeopardize the device if the MOL contact shorts the work function metal (WFM) because there is no self-alignment.

The exemplary embodiments of the present invention alleviate such shortcomings by enabling a placement of a contact landing on a SADP sacrificial fin with self-alignment capability. The sacrificial fin is employed to self-align the MOL contact (CR) to maintain a very small critical dimension (CD), as opposed to increasing surface area of the contact.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

The structures of the present invention can be manufactured in a number of ways using a number of different tools. In general, though, the methodologies and tools are used to form structures with dimensions in the micrometer and nanometer scale. The methodologies, e.g., technologies, employed to manufacture the structures have been adopted from integrated circuit (IC) technology. For example, the structures of the present invention are built on wafers and are realized in films of material patterned by photolithographic processes on the top of a wafer. In particular, the fabrication of the structures of the present invention employs three basic building blocks: deposition of thin films of material on a substrate, applying a patterned mask on top of the films by photolithographic imaging, and etching the films selectively to the mask.

Figure 1:
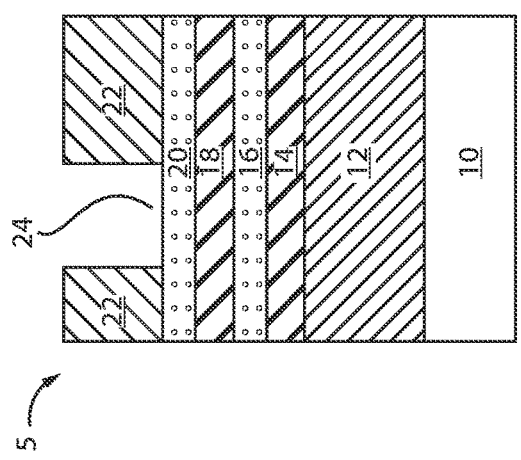
FIG. 1 is a cross-sectional view of a semiconductor structure including a mandrel formed over a fin structure, in accordance with an embodiment of the present invention.

FIG. 1 is a cross-sectional view of a semiconductor structure including a mandrel formed over a fin structure, in accordance with an embodiment of the present invention.

The semiconductor structure 5 includes a fin structure 12 formed over a substrate 10. A stack of dielectric layers are deposited over the fin structure 12. The stack of dielectric layers includes a bottom nitride layer 14, a first oxide layer 16, a top nitride layer 18, and a second oxide layer 20. A mandrel layer 22 is deposited and patterned over the stack of dielectric layers. The patterning results in openings 24.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor ate al including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a. hybrid oriented (HOT) semiconductor substrate in which the HOT substrate has surface regions of different crystallographic orientation.

As used herein, a "fin structure" 12 refers to a semiconductor material, which is employed as the body of a semiconductor device, in which the gate structure is positioned around the fin structure such that charge flows down the channel on the two sidewalk of the fin structure and optionally along the top surface of the fin structure. A Fin Field Effect Transistor (FinFET) is a semiconductor device that positions the channel region of the semiconductor device in a fin structure.

The material that provides the fin structure 12 can be a silicon-containing material, such as single crystal silicon (Si), monocrystalline silicon (Si), polycrystalline silicon (Si) or a combination thereof. In some embodiments, the fin structure 12 can be formed from a semiconductor on insulator (SOI) substrate, in which the upper layer of the SOI substrate, SOI layer, provides the material for the fin structure 12.

The dielectric layers 14, 16, 18, 20 can include, but are not limited to, SiN, SiOCN, SiC, SiOC, SiBCN, $SO_2$, $SiO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectric layers 14, 16, 28, 20 can be conformally deposited using atomic layer deposition (ALD) or, chemical vapor deposition (CVD). Variations of CVD processes suitable for forming the dielectric layers 14, 16, 18, 20 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

The oxide layers can be made of, for example, silicon dioxide ($SiO_2$). In some embodiments, the oxide layers can be made of, for example, a low-k dielectric material, e.g., SiCOH, SiC, SiCN, SiN, other dielectric material or combinations thereof In some embodiments, mandrel portions 22 are formed of amorphous silicon (a-Si) or another material that has a high etching selectivity with the underlying dielectric layers 14, 16, 18, 20.

The mandrel material can be deposited, for example, by CVD or spin coating. The thickness of the mandrel material can be from 30 nm to 300 nm, although lesser and greater thicknesses can also be employed.

Figure 2:
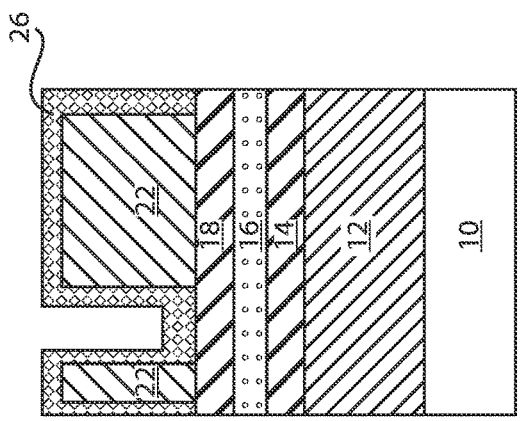
FIG. 2 is a cross-sectional view of the semiconductor structure of FIG. 1 where a spacer is deposited, in accordance with an embodiment of the present invention.

FIG. 2 is a cross-sectional view of the semiconductor structs re of FIG. 1 where a spacer is deposited, in accordance with an embodiment of the present invention.

In some embodiments, a spacer 26 can be formed using a sidewall image transfer (SIT) technique. The spacer 26 is formed over the mandrel 22.

The material of spacer 26 is selected to have a high etching selectivity with top layers 18 and 20. For example, the material of spacer 26 can be selected from AlO, AN, AlON, TaN, TiN, TiO, Si, $SiO_2$, SiN, metals, and metal alloys.

In some embodiments, the mandrel portions 22 can be polysilicon, the spacers 24 can be nitride, and the dielectric layers 16, 20 can be an oxide. In other embodiments, the dielectric layers 14, 18 can include nitride, the mandrel portions 22 can include amorphous carbon, and the spacers 24 can include a metal, such as titanium nitride (TiN), or oxide.

FIG. 3 is a cross-sectional view of the semiconductor structure of FIG. 2 where the spacer is etched back, in accordance with an embodiment of the present invention.

In various example embodiments, the spacer 26 is etched back. The spacer etch results in vertical spacer portions 28, as well as opening 29 in a non-mandrel section.

Etching of the spacer 26 includes an anisotropic etch and can include any appropriate dry etch chemistry such as reactive ion etching (RIE) with an etchant including $CF_4$, $CH_3F$, $CH_2F_2$, and/or any combination of CxFy in conjunction with $O_2$, N2 and Ar.

Figure 4:
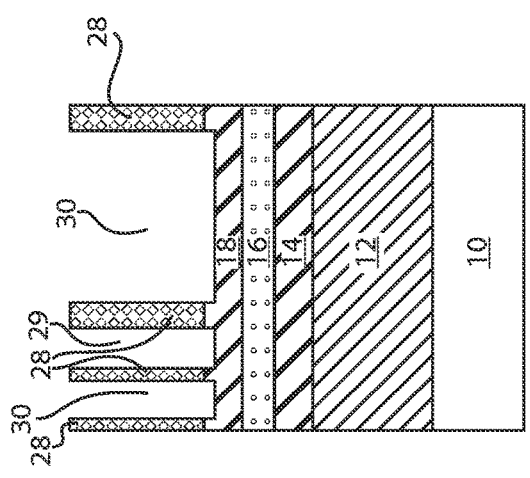
FIG. 4 is a cross-sectional view of the semiconductor structure of FIG. 3 where the mandrel is removed, in accordance with an embodiment of the present invention.

FIG. 4 is a cross-sectional view of the semiconductor structure of FIG. 3 where the mandrel is removed, in accordance with an embodiment of the present invention.

In various example embodiments, the mandrel is removed 22. Each mandrel structure can be removed by an etching process that is selective to the vertical spacer portions 28 and the top layer 18. The removal of the mandrel 22 results in openings 30 formed between the spacer portions 28.

Figure 5:
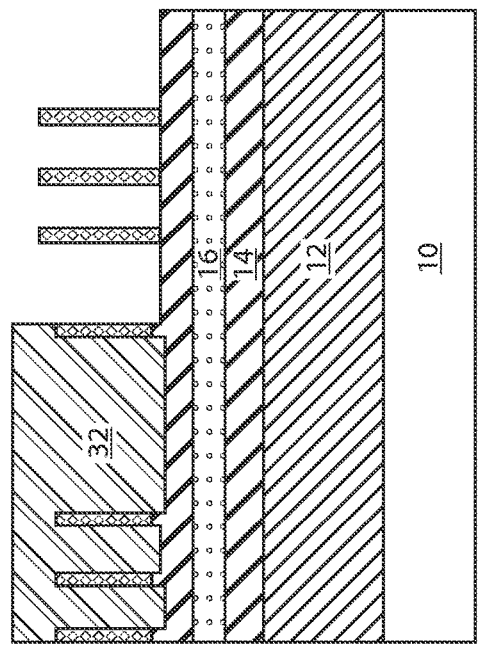
FIG. 5 is a cross-sectional view of the semiconductor structure of FIG. 4 where a block mask is deposited, in accordance with an embodiment of the present invention.

FIG. 5 is a cross-sectional view of the semiconductor structure of FIG. 4 where a block mask is deposited, in accordance with an embodiment of the present invention.

In various example embodiments, a mask layer 32 is deposited over a portion of the structure. Mask layer 32 can be referred to as a block mask. Mask layer 32 can be any suitable resist. Suitable resists include photoresists, electron-beam resists, ion-beam resists, X-ray resists, and etchant resists. The resist can include a polymeric material, for example, that can be applied by spin casting. The mask can be removed by, for example, an asking process.

Mask layer 32 can be formed by spin coating a photo resist material followed by photolithography to form one or more of opening(s).

The right-hand side of the structure that does not include the mask layer 32 can be referred to as the open cut area.

Mask layer 32 can be subsequently removed, for example, using a solvent or an aqueous developer, for example, using N-methyl-2-pyrrolidone (NMP), toluene, propylene glycol methyl ether acetate (PGMEA), tetramethylammonium hydroxide (TMAH), or a combination including at least one of the foregoing.

Figure 6:
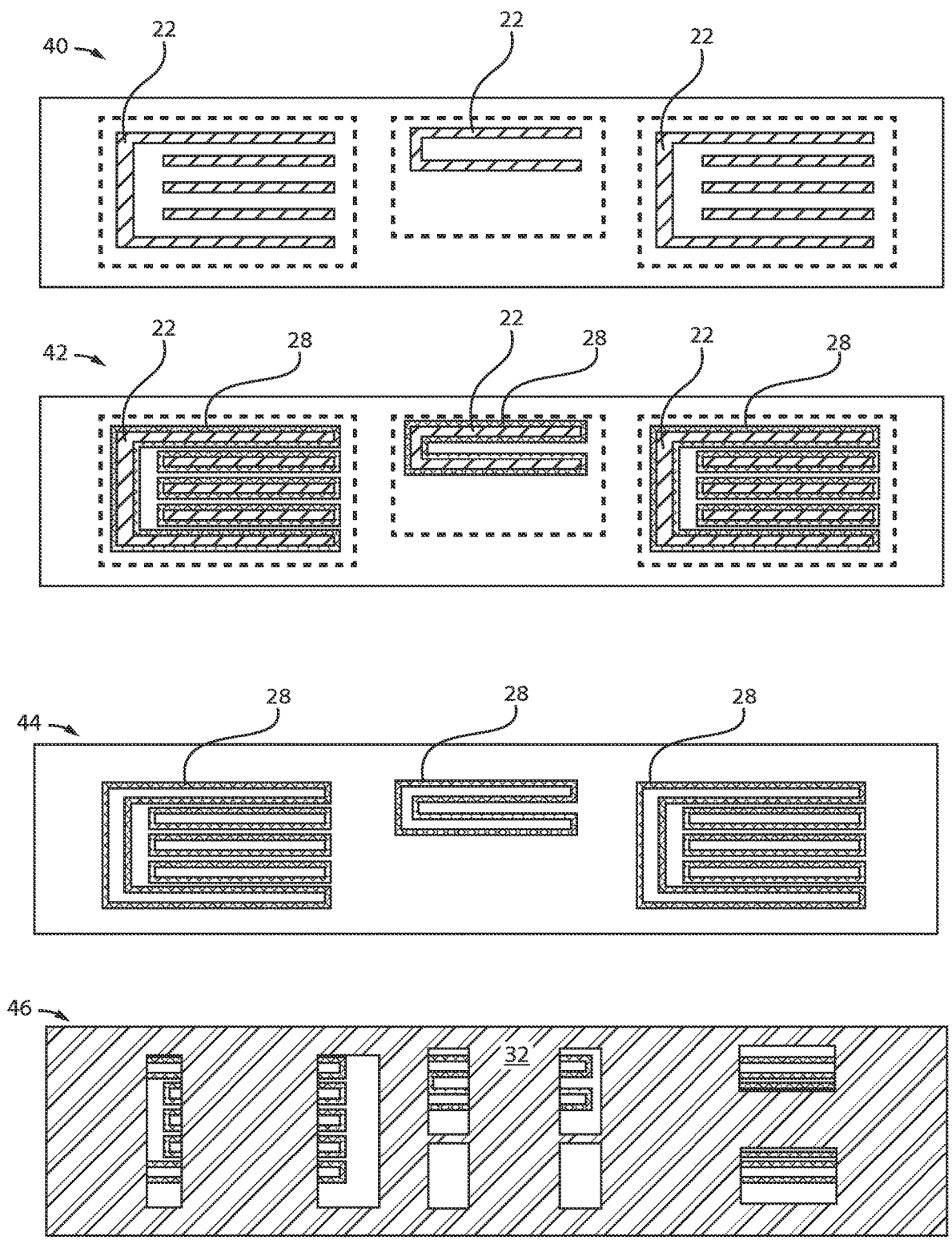
FIG. 6 is a top view of the semiconductor structures of FIGS. 1-5, in accordance with an embodiment of the present invention.

FIG. 6 is a top view of the semiconductor structures of FIGS. 1-5, in accordance with an embodiment of the present invention.

In various example embodiments, the top view 40 illustrates the U-shaped mandrel portions 22.

The top view 42 illustrates the spacer portions 28 formed adjacent the mandrel portions 22.

The top view 44 illustrates the removal of mandrel portions 22. Thus, only spacer portions 28 remain. The spacer portions 28 form a substantially U-shaped configuration.

The top view 46 illustrates application of the block mask 32.

Figure 7:
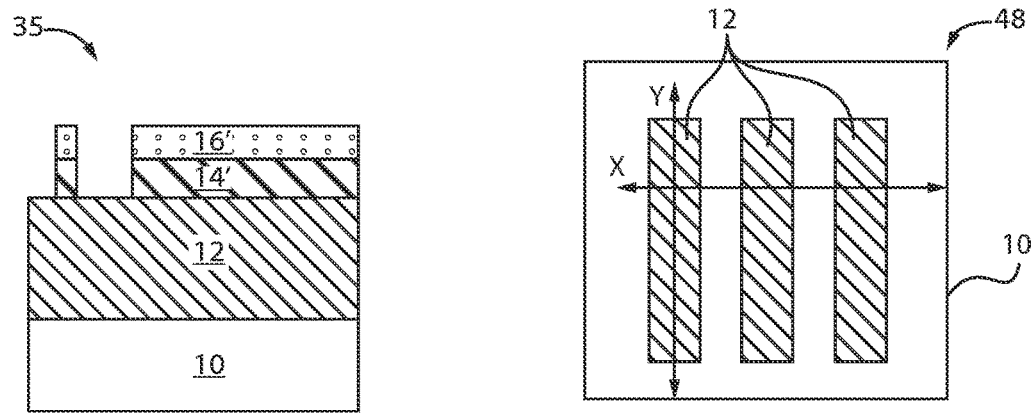
FIG. 7 is a cross-sectional view of the semiconductor structure of FIG. 5 where the spacer portions are removed and dielectric layers are etched to expose a top surface of the fin structure, in accordance with an embodiment of the present invention.

FIG. 7 is a cross-sectional view of the semiconductor structure of FIG. 5 where the spacer portions are removed and dielectric layers are etched to expose a top surface of the fin structure, in accordance with an embodiment of the present invention.

In various example embodiments, in structure 35, the spacer portions 28 are etched away, and portions of the dielectric layers 14, 16 are selectively etched such that nitride layer 14' and oxide layer 16' remain.

Top view 48 illustrates the substrate 10 and the fin structures 12 formed over the substrate 10.

Figure 8:
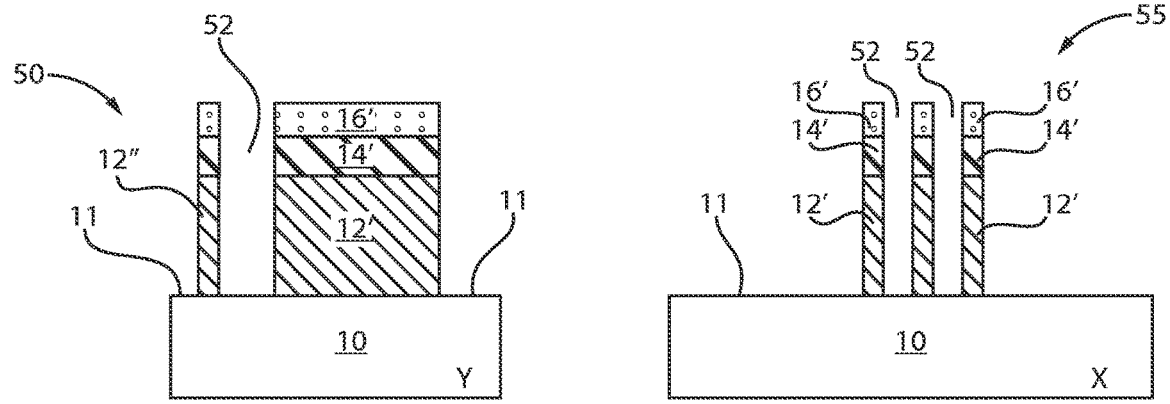
FIG. 8 illustrates cross-sectional views of the semiconductor structure of FIG. 7 along an X-direction and along a Y-direction, where the fin structure is etched, in accordance with an embodiment of the present invention.

FIG. 8 illustrates cross-sectional views of the semiconductor structure of FIG. 7 along an X-direction and along a Y-direction, where the fin structure is etched, in accordance with an embodiment of the present invention.

In various example embodiments, structure 50, which is a cross-sectional view taken along the X direction (along the fin) in top view 48, depicts etching of the fin structure 12. This results in remaining fin structures 12', 12" and the exposure of top surface 11 of substrate 10. An opening 52 is illustrated between fins structures 12', 12".

In various example embodiments, structure 55, which is a cross-sectional view taken along the Y direction (across the tin) in top view 48, depicts etching of the fin structure 12. This results in openings 52 formed between remaining fin structures 12'. The fins 12' include remaining nitride layer portions 14' and remaining oxide layer portions 16'.

Figure 13:
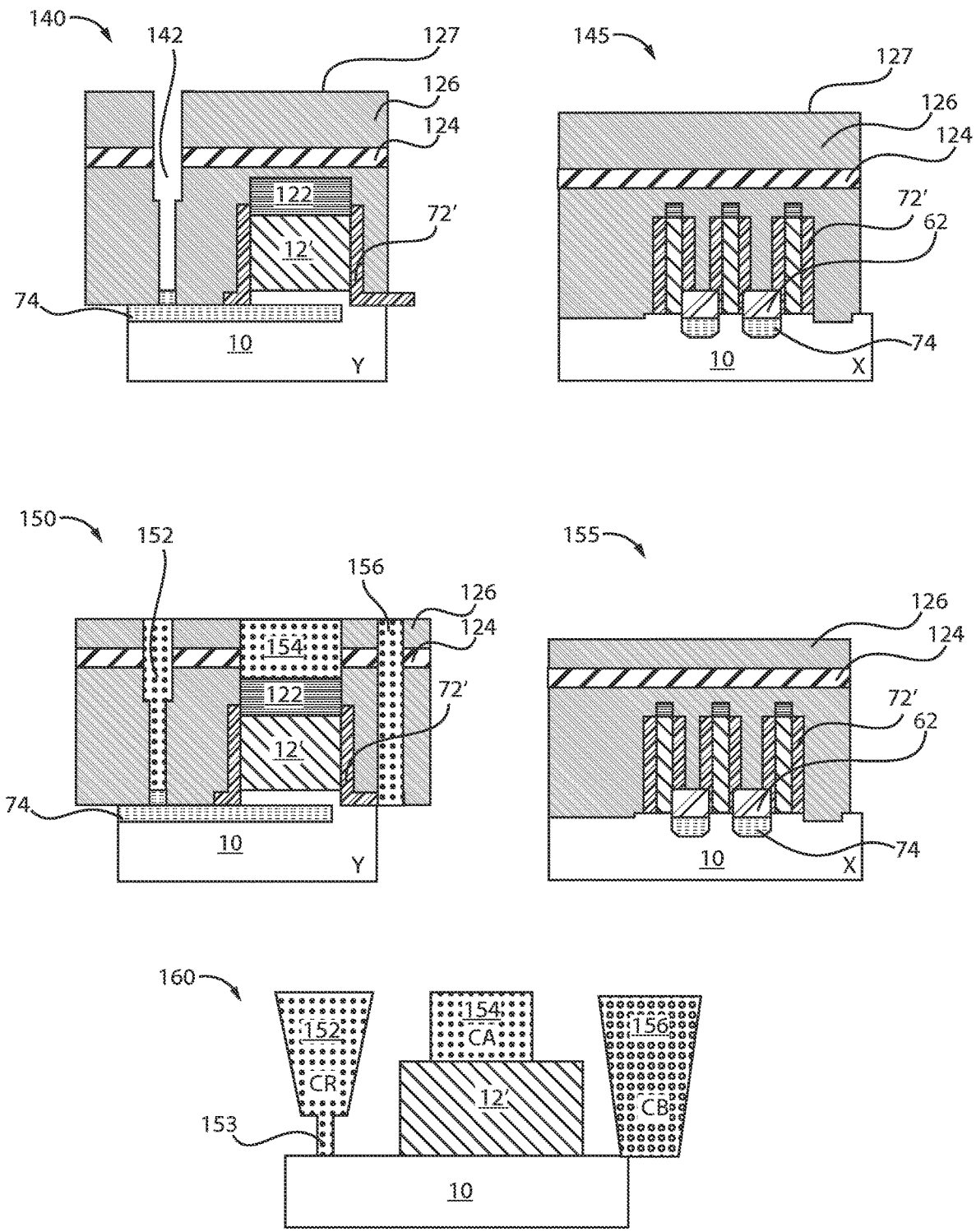
FIG. 13 illustrates cross-sectional views of the semiconductor structure of FIG. 12 along an X-direction and along a Y-direction, where a via is formed and filled with a conductive material, in accordance with an embodiment of the present invention.

Fins 12' are active fins, whereas fin 12" is a sacrificial fin. It is noted that the left fin structure 12" (thin fin) is the sacrificial fin, whereas the right fin structures 12' (fat fin) are active fins. The subsequent removal of the sacrificial fin 12" (thin fin) will enable placement of the CR MOL contact (FIG. 13). A width of the sacrificial fin 12" is less than a width of each of the plurality of active fins 12'.

Figure 9:
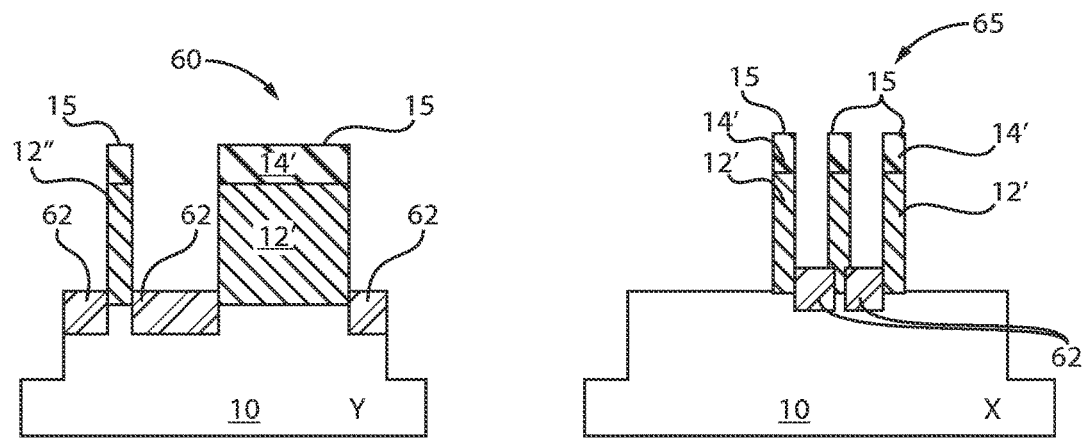
FIG. 9 illustrates cross-sectional views of the semiconductor structure of FIG. 8 along an X-direction and along a Y-direction, where a bottom spacer is deposited, in accordance with an embodiment of the present invention.

FIG. 9 illustrates cross-sectional views of the semiconductor structure of FIG. 8 along an X-direction and along a Y-direction, where a bottom spacer is deposited, in accordance with an embodiment of the present invention.

In various example embodiments, structure 60, which is a cross-sectional view taken along the X direction in top view 48, depicts depositing of a bottom spacer 62, Bottom spacer 62 is formed between the fin structures 12', 12". Additionally, the remaining oxide layer portions 16' are removed to expose a top surface 15 of the remaining nitride layer portions 14'.

In various example embodiments, structure 65, which is a cross-sectional view taken along the Y direction in top view 48, depicts the removal of the remaining oxide layer portions 16' and the deposition of the bottom spacer 62 between the fin structures 12'.

Figure 10:
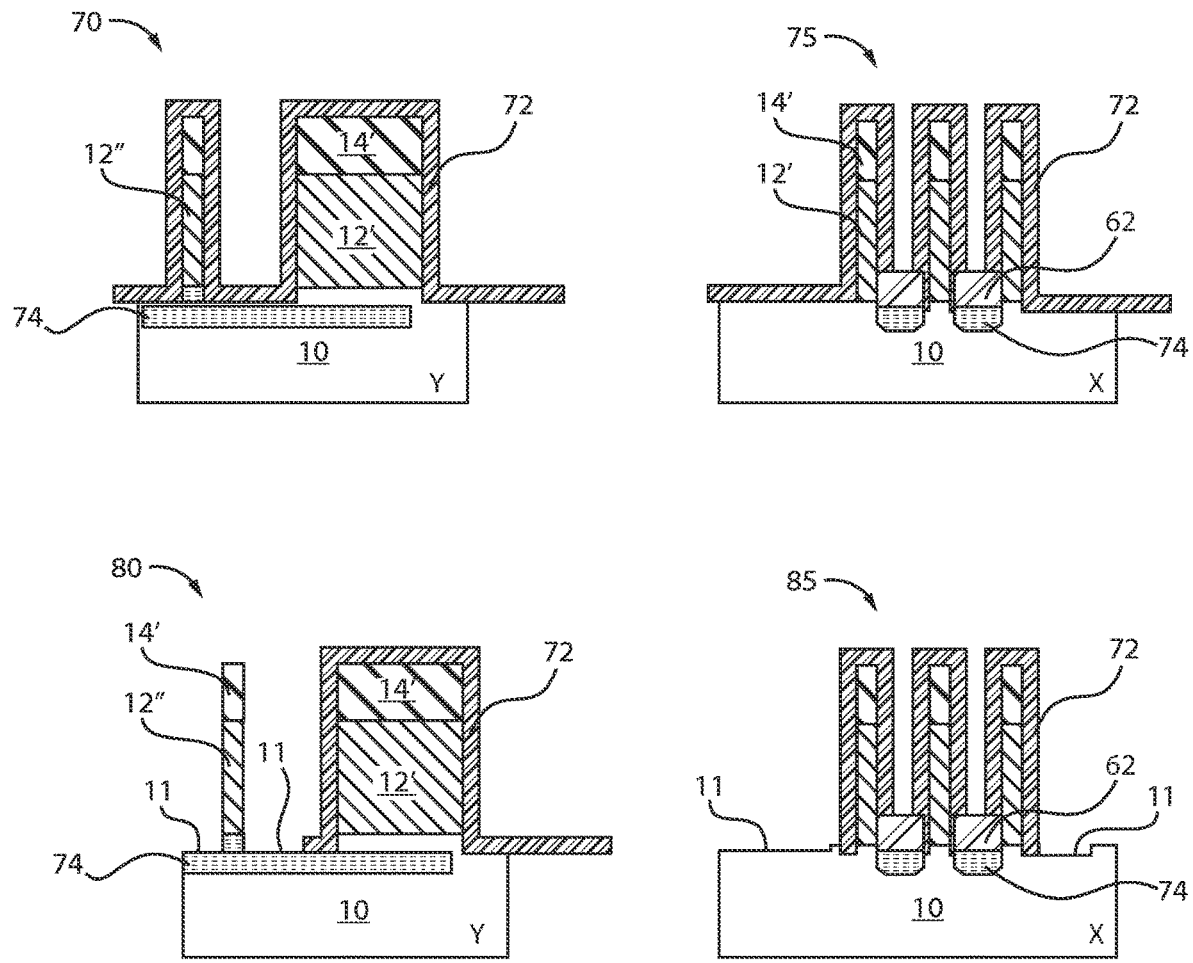
FIG. 10 illustrates cross-sectional views of the semiconductor structure of FIG. 9 along an X-direction and along a Y-direction, where a bottom epi is formed, and a work function metal (WFM) layer is deposited and selectively etched, in accordance with an embodiment of the present invention.

FIG. 10 illustrates cross-sectional views of the semiconductor structure of FIG. 9 along an X-direction and along a Y-direction, where a bottom epi is formed, and a work function metal (WFM) layer is deposited and selectively etched, in accordance with an embodiment of the present invention.

In various example embodiments, structures 70 and 80 are cross-sectional views taken along the X direction in top view 48, where a work function metal (WFM) layer 72 is deposited and selectively etched. An epi layer 74 is also formed under the fin structures 12', 12". The epi layer 74 is formed directly underneath the bottom spacer 62. The WFM layer 72 is selectively etched everywhere except for the active fin regions (structure 80).

In various example embodiments, structures 75 and 85 are cross-sectional views taken along the Y direction in top view 48, where the WFM layer 72 and the epi layers 74.

In various embodiments, the WFM layer 72 can be a nitride, including but not limited to titanium nitride (TiN), titanium aluminum nitride (TiAlN), hafnium nitride (HN), hafnium silicon nitride (HtSiN), tantalum nitride (TaN), tantalum silicon nitride (TaSiN), tungsten nitride (WN), molybdenum nitride (MoN), niobium nitride (NbN); a carbide, including but not limited. to titanium carbide (TiC), titanium aluminum carbide (TiAlC),titanium aluminum carbide (TiAlC), tantalum carbide (TaC), hafnium carbide (HfC), and combinations thereof.

Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

Generally, regarding epi layers 74, epitaxial growth, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at, the deposition surface of the semiconductor material with sufficient energy to move around on the surface and orient themselves to the crystal arrangement of the atoms of the deposition surface. Therefore, an epitaxial a has the same crystalline characteristics as the deposition surface on which it is formed. For example, an epitaxial material deposited on a <100> crystal surface will take on a <100> orientation.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and can be conducted at higher or lower temperatures as needed.

Figure 11:
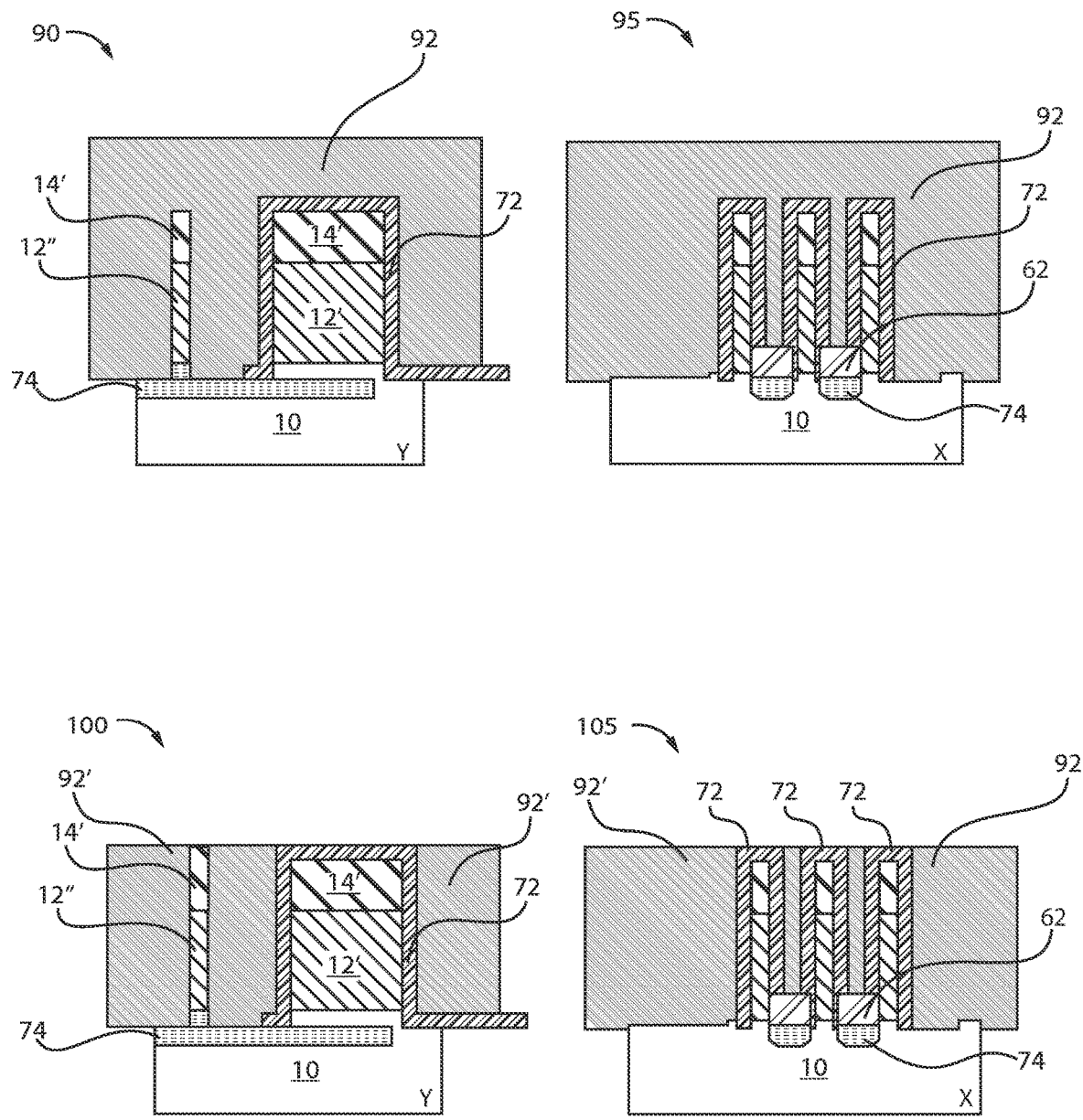
FIG. 11 illustrates cross-sectional views of the semiconductor structure of FIG. 10 along an X-direction and along a Y-direction, where an inter-layer dielectric (ILD) is deposited and planarized, in accordance with an embodiment of the present invention.

FIG. 11 illustrates cross-sectional views of the semiconductor structure of FIG, 10 along an X-direction and along a Y-direction, where an inter-layer dielectric (ILD) is deposited and plagiarized, in accordance with an embodiment of the present invention.

In various example embodiments, structures 90 and 100 are cross-sectional views taken along the X direction in top view 48, where an interlayer dielectric (ILD) 92 is deposited and planarized. The ILD 92 is planarized such that a top surface of the ILD is flush or level with the top surface of WFM layer 72.

In various example embodiments, structures 95 and 105 are cross-sectional views taken along the Y direction in top view 48, where the ILD 92 is deposited and planarized. After planarization, the ILD 92 can be designated as ILD sections 92'.

The ILD 92 can include any materials known in the art, such as, for example, porous silicates, carbon doped oxides, silicon dioxides, silicon nitrides, silicon oxynitrides, or other dielectric materials. The ILD 92 can be formed using any method known in the art, such as, for example, chemical vapor deposition, plasma enhanced chemical vapor deposition, atomic layer deposition, or physical vapor deposition. The ILD 92 can have a thickness ranging from about 200 nm to about 2000 nm as deposited, The dielectric material of layer 92 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

One example of a material suitable for the low-k materials for the low-k dielectric layer 92 can include silicon oxycarbonitride (SiOCN). Other low-k materials that can also be used for the low-k material layer 92 can include fluorine doped silicon dioxide, carbon doped silicon dioxide, porous silicon dioxide, porous carbon doped silicon dioxide, organosilicate glass (OSG), diamond-like carbon (DLC) and combinations thereof.

Figure 12:
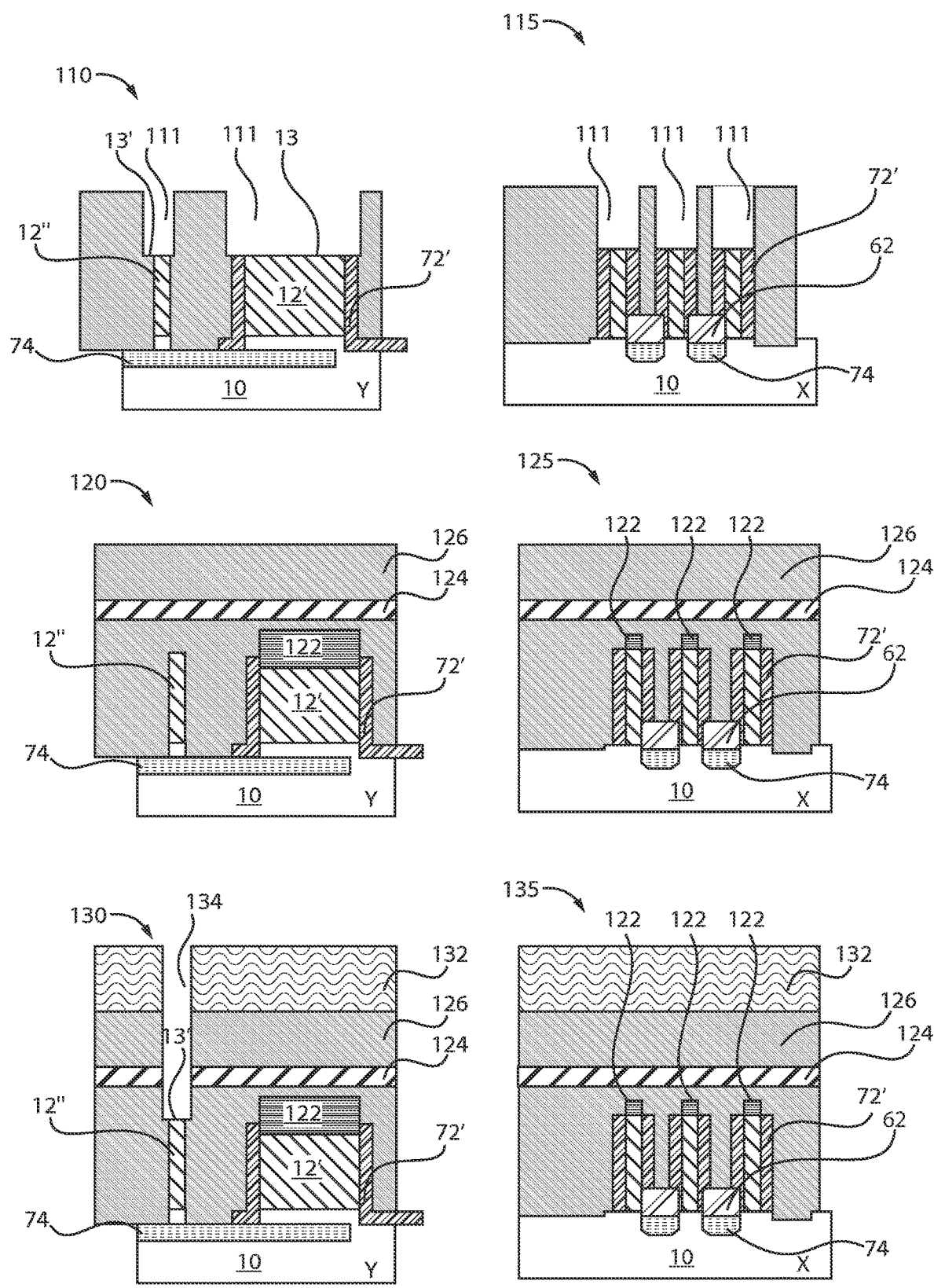
FIG. 12 illustrates cross-sectional views of the semiconductor structure of FIG. 11 along an X-direction and along a Y-direction, where the is selectively etched to a top surface of the fin structure, a top epi region is deposited, and dielectric regions are deposited over the top epi, in accordance with an embodiment of the present invention.

FIG. 12 illustrates cross-sectional views of the semiconductor structure of FIG. 11 along an X-direction and along a Y-direction, where the ILD is selectively etched to a top surface of the fin structure, a top epi region is grown, and dielectric regions are deposited over the top epi, in accordance with an embodiment of the present invention.

In various example embodiments, structures 110, 120, 130 are cross-sectional views taken along the X direction in top view 48, where remaining nitride layer portions 14' are removed to expose top surfaces 13, 13' of the remaining fin structures 12', 12", respectively. Openings 111 are formed over the remaining fin structures 12', 12". In structure 120, a top epi layer 122 is grown over the active fin structures 12' only (active fins). A pair of dielectrics layers 124, 126 can be deposited thereafter. In one example, dielectric layer 124 is a nitride layer and dielectric layer 126 is an oxide layer. In structure 130, a mask layer 132 is deposited over the dielectric layers 124, 126, and a via 134 is formed through the mask layer 132, the dielectric layers 124, 126, and the ILD 92', the via 134 exposing a top surface 13' of the non-active fin structure. The opening 111 also results in WFM sections 72' remaining adjacent active fins 12'.

In various example embodiments, structures 115, 125, 135 are cross-sectional views taken along the Y direction in top view 48, where the ILD is etched to expose the top surfaces 13, 13' of the remaining fin structures 12', 12", respectively, dielectric layers 124, 126 are deposited, a mask layer 132 is deposited, and a via 134 is formed (not shown in Y-direction).

Non-limiting examples of suitable dielectric layers 124, 126 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, or any combination thereof.

Non-limiting examples of suitable materials for the dielectric layers 124, 126 include oxides, nitrides, oxynitrides, silicates (e.g., metal silicates), aluminates, titanates, nitrides, or any combination thereof.

FIG. 13 illustrates cross-sectional views of the semiconductor structure of FIG. 12 along an X-direction and along a Y-direction, where a via is formed and filled with a conductive material, in accordance with an embodiment of the present invention.

In various example embodiments, structures 140, 150 are cross-sectional views taken along the X direction in top view 48, where the exposed non-active or sacrificial fin 12" is removed to form via 142 and the via 142 is filled with a conductive material 152 to form contact 152 (CR). Additionally, contacts 154 (CA) and 156 (CB) are formed. The mask layer 132 is also removed thus exposing the top surface 127 of the dielectric layer 126.

In various example embodiments, structures 145, 155 are cross-sectional views taken along the Y direction in top view 48. This directional cut does not depict the formation of the contact landing.

Structure 160 further illustrates the contacts 152, 154, 156, The contact 152 (CR) is formed such that a lower portion or section or region defines a contact landing 153. The contact landing 153 is narrower or thinner than the contact 152 (CR). Thus, the contact 152 (CR) does not directly contact the substrate 10. Instead, contact landing 153 separates the CR contact 152 from the substrate 10. The placement of the contact landing 153 of the CR contact 152 on a sacrificial fin enables self-alignment capability. Thus, the CA contact 154 directly contacts the active fin structure 12', the CB contact 156 directly contacts the substrate 10, and the CR MOL contact act 152 is formed over and in direct contact with a contact landing 153, the contact landing 153 taking the place of the sacrificial fin 12".

The conductive material can be any conductive materials known in the art, such as, for example, copper (Cu), aluminum (Al), tungsten (W), ruthenium (Ru) or cobalt (Co). The conductive layer can be fabricated using any technique known in the art.

Non-limiting examples of suitable conductive materials include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, grapheme, or any suitable combination of these materials. The conductive material can further include dopants that are incorporated during or after deposition. The conductive metal can be deposited by a suitable deposition process, for example, CVD, PECVD, PVD, plating, thermal or e-beam evaporation, and sputtering.

Figure 14:
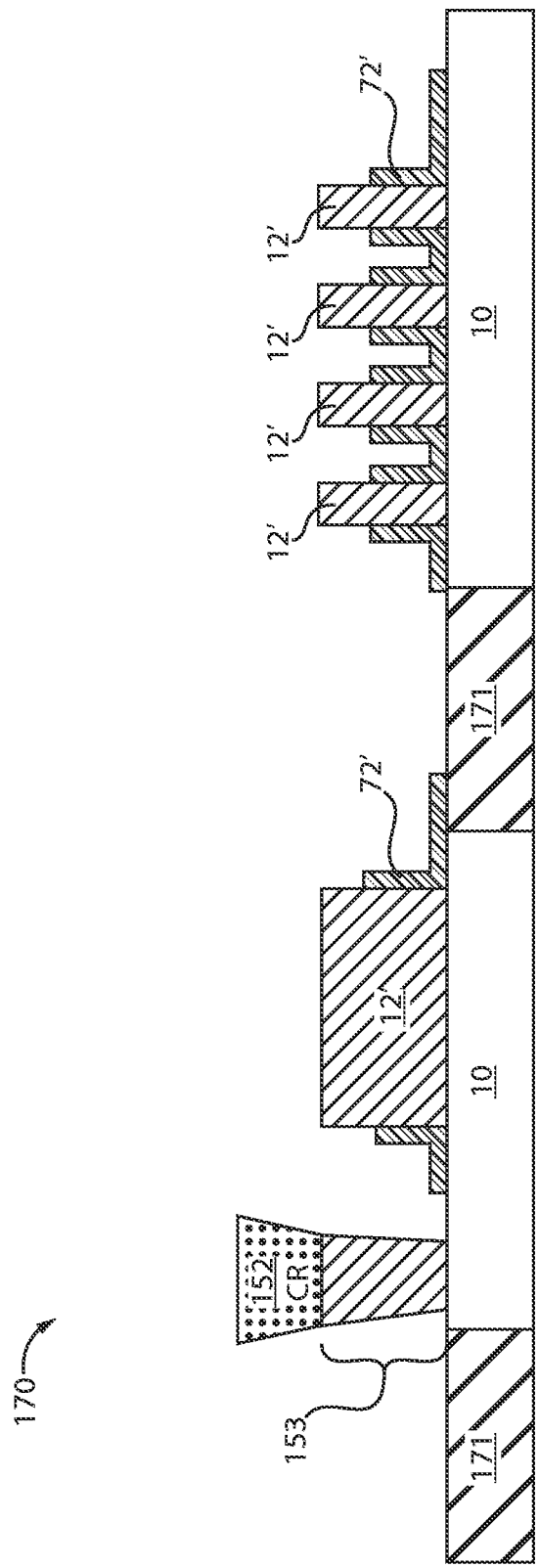
FIG. 14 is a cross-sectional view of the semiconductor structure depicting a pillar formed between the substrate and the CR contact, in accordance with an embodiment of the present invention.

FIG. 14 is a cross-sectional view of the semiconductor structure depicting a pillar formed between the substrate and the CR contact, in accordance with an embodiment of the present invention.

Structure 170 illustrates the contact 152 (CR) formed on a contact landing 153. Thus, the contact 152 (CR) does not directly contact the substrate 10. Instead, contact landing 153 separates the CR contact 152 from the substrate 10. The contact landing 153 is thinner than the CR contact 152. The contact landing 153 is defined by the width of the fin structure 12". The placement of the contact landing 153 of the CR contact 152 on a sacrificial fin enables self-alignment capability. Shallow trench isolation (STI) regions 171 can separate several substrates 10 from each other. Sonic substrates 10 can include active fins only and some substrates 10 can include active fins 12' and inactive fins 12". The active fins 12' directly contact WFM layer portions 72'. The inactive fin 12" separates the CR contact 152 from the substrate 10. Additionally, a critical dimension of the self-aligned MOL contact is defined by a width of the sacrificial fin 12".

In summary, the exemplary embodiments enable placement of a contact landing on a SADP sacrificial fin with self-alignment capability. The sacrificial fin is employed to self-align the MOL contact (CR) to maintain a very small critical dimension (CD), as opposed to increasing surface area of the contact.

Regarding FIGS. 1-14, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular bea.m epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma. CM (HDPCVD), rapid thermal CVD (RTCVD), ultra-high vacuum CND (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

A pre-clean wet etch process, such as a buffered hydrofluoric acid (BHF) etch, is a material removal process that uses liquid chemicals or etchants to remove materials from a surface. BHF is a mixture of a buffering agent and hydrofluoric acid (HF). The buffering agent provides a greater process control than HF alone and can be, for example, ammonium fluoride ($NH_4F$). Wet etch processes, such as BHF, can advantageously remove native silicon oxide or silicon nitride films during an epitaxy pre-clean.

A pre-clean dry etch process, such as, for example, an in-situ pre-clean etch process, uses an in-situ remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The resulting etch is largely conformal and selective towards silicon oxide layers but does not readily etch silicon regardless of whether the silicon is amorphous, crystalline or polycrystalline. This selectivity provides advantages for applications such as shallow trench isolation (STI) and ILD recess formation and cleaning. A dry etch process can produce solid by-products which grow on the surface of the substrate as substrate material is removed. These solid by-products can be subsequently removed via sublimation when the temperature of the substrate is raised.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and. C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising." "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments for methods and devices for placement of a contact landing on a sacrificial fin with self-alignment capability (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a self-aligned middle-of-the-line (MOL) contact in MOL processing, the method comprising:
    etching a fin structure to form a sacrificial fin and a plurality of active fins;
    depositing a work function metal (WFM) layer over the plurality of active fins;
    forming a first via portion to expose a top surface of the sacrificial fin;
    removing the sacrificial fin to form a second via portion; and
    filling the first and second via portions with a conductive material to form a self-aligned MOL contact in the first via portion and a contact landing in the second via portion replacing the sacrificial fin such that a top surface of the contact landing directly contacts a bottom surface of the MOL contact to enable self-alignment and maintain a limited critical dimension (CD) defined by a width of the sacrificial fin.

2. The method of claim 1, wherein a bottom spacer is deposited after deposition of the WFM layer.

3. The method of claim 1, wherein a bottom epi layer is formed under the sacrificial fin and the plurality of active fins.

4. The method of claim 3, wherein a top epi layer is formed over the plurality of active fins before depositing a set of dielectric layers.

5. The method of claim 1, wherein a width of the sacrificial fin is less than a width of each of the plurality of active fins.

6. The method of claim 1, wherein a critical dimension of the self-aligned MOL contact is defined by a width of the sacrificial fin.

7. The method of claim 1, wherein the WFM layer directly contacts sidewalls of the plurality of active fins.

8. The method of claim 1, wherein a bottom epi layer is disposed under and in direct contact with the contact landing.

9. The method of claim 8, wherein an entirety of a bottom surface of the contact landing engages a top surface of the bottom epi layer.

10. The method of claim 9, wherein the bottom epi layer extends under the self-aligned MOL contact and under the active fin.

11. A method for forming a self-aligned middle-of-the-line (MOL) contact in MOL processing, the method comprising:
  forming a sacrificial fin and a plurality of active fins over a substrate by employing a U-shaped mandrel;
  forming a first via portion extending to a top surface of the sacrificial fin;
  removing the sacrificial fin to form a second via portion; and
  filling the first and second via portions with a conductive material to form the self aligned MOL contact in the first via portion and a contact landing in the second via portion replacing the sacrificial fin such that a top surface of the contact landing directly contacts a bottom surface of the MOL contact to enable self-alignmentand maintain a limited critical dimension (CD) defined by a width of the sacrificial fin.

12. The method of claim 11, wherein a width of the sacrificial fin is less than a width of each of the plurality of active fins.

13. The method of claim 11, wherein a critical dimension of the self-aligned MOL contact is defined by a width of the sacrificial fin.

14. The method of claim 11, wherein a bottom epi layer is formed under the sacrificial fin and the plurality of active fins.

15. The method of claim 14, wherein a top epi layer is formed over the plurality of active fins before depositing dielectric layers.

16. The method of claim 15, wherein a WFM layer directly contacts sidewalk of the plurality of active fins.

17. The method of claim 16, wherein a bottom spacer is deposited after deposition of the WFM layer.

18. The method of claim 11, wherein a bottom epi layer is disposed under and in direct contact with the contact landing.

19. The method of claim 18, wherein an entirety of a bottom surface of the contact landing engages a top surface of the bottom epi layer.

20. The method of claim 19, wherein the bottom epi layer extends under the self-aligned MOL contact and under the active fin.

* * * * *